(12) United States Patent
Becker et al.

(10) Patent No.: US 6,188,970 B1
(45) Date of Patent: Feb. 13, 2001

(54) METHOD OF CALIBRATING A MULTISTAGE SELECTIVE AMPLIFIER

(75) Inventors: Karl Anton Becker, Karlsbad; Stefan Brinkhaus, Remchingen; Armin Ganz, Bietigheim; Bernd Memmler, Rosengarten; Hans-Eberhardt Kroebel, Heilbronn, all of (DE)

(73) Assignees: Temic Semiconductor GmbH, Heilbronn; Becker GmbH, Karlsbad, both of (DE)

( * ) Notice: Under 35 U.S.C. 154(b), the term of this patent shall be extended for 0 days.

(21) Appl. No.: 09/156,366

(22) Filed: Sep. 17, 1998

(30) Foreign Application Priority Data

Sep. 19, 1997 (DE) ................................. 197 41 325

(51) Int. Cl.[7] .............................. G01R 35/00; H04B 1/16
(52) U.S. Cl. ......................... 702/106; 702/85; 702/107; 455/179.1; 455/197.1; 455/195.1
(58) Field of Search ....................... 702/106, 85, 107, 702/72, 75; 455/178.1, 187.1, 191.1, 179.1, 180.3, 182.1, 195.1, 197.1, 180.4, 161.1; 324/601

(56) References Cited

U.S. PATENT DOCUMENTS

| | | |
|---|---|---|
| 5,428,829 | 6/1995 | Osburn et al. . |
| 5,511,012 | 4/1996 | Deville . |

FOREIGN PATENT DOCUMENTS

| | | |
|---|---|---|
| 2524171 | 12/1976 | (DE) . |
| 0044237 | 1/1982 | (EP) . |
| 0417518 | 7/1985 | (EP) . |
| 0601743 | 6/1994 | (EP) . |
| 0624949 | 11/1994 | (EP) . |
| 0766391 | 4/1997 | (EP) . |

*Primary Examiner*—Marc S. Hoff
*Assistant Examiner*—Hien Vo
(74) *Attorney, Agent, or Firm*—W. F. Fasse; W. G. Fasse

(57) ABSTRACT

In a method for calibrating or aligning a multistage selective amplifier including an oscillator circuit and at least one tuning circuit, the tuning voltages respectively necessary for aligning the respective tuning circuits to the required receiving frequency are calculated directly from a mathematical relationship between the respective tuning voltage and the oscillator voltage. In order to achieve this, a characteristic multiplicative coefficient and a characteristic additive factor for each tuning circuit are stored in a memory upon manufacturing or switching on the device. In order to select a desired receiving frequency, the respective stored values as well as an oscillator voltage are provided to an amplification circuit, which correspondingly amplifies the oscillator voltage by the multiplicative coefficient and the additive factor and then provides the resulting output value as a tuning voltage to the respective tuning circuit. Thus, all necessary tuning voltages can be determined from the two respective stored values per tuning circuit, as necessary for selecting any desired receiving frequency.

20 Claims, 4 Drawing Sheets

METHOD OF CALIBRATING A MULTISTAGE SELECTIVE AMPLIFIER

PRIORITY CLAIM

This application is based on and claims the priority under 35 U.S.C. §119 of German patent application 197 41 325.0, filed on Sep. 19, 1997, the entire disclosure of which is incorporated herein by reference.

FIELD OF THE INVENTION

The invention relates to a method of calibrating or aligning a multistage selective amplifier, and particularly a tuner, that includes an oscillator circuit and at least one tuning circuit, wherein the receiving frequency is selected by providing an adjustable frequency-determining oscillator tuning voltage for the oscillator and adjustable frequency-determining tuning voltages for the respective tuning circuits.

BACKGROUND INFORMATION

By using selective amplifier circuits embodied as tuners, various broadcast programs, such as radio or television programs, or any signal in general can be received on a selected one of various frequencies, amplified and then reproduced. Tuning circuits are necessary for selecting the desired receiving frequency, which makes it possible to receive a particular signal that is being transmitted on this frequency. In this context, an oscillator circuit establishes an oscillator frequency that is shifted by a fixed intermediate frequency relative to the desired receiving frequency, and then provides this oscillator frequency to a mixer. Input, drain, and/or intermediate circuits, which serve as a frequency filter for filtering at the receiving frequency are connected in the circuit before the mixer. The reception signal is prefiltered through the input, drain and/or intermediate circuits, and then the prefiltered signal is also provided to the mixer. The fixed intermediate frequency is formed from the oscillator frequency and the prefiltered reception signal.

In this context, the tuning circuit serves to ensure that the input circuit, drain circuit, and/or intermediate circuits are tuned to the desired receiving frequency, and that the oscillator circuit is tuned to the corresponding oscillator frequency that is frequency shifted by the intermediate frequency (IF) relative to the receiving frequency. When all of the circuits are tuned to the respective intended nominal frequencies, this condition is designated as aligned, balanced or synchronous operation, with which the optimum reception is ensured.

The prior art methods of achieving such calibrating and tuning of a multistage selective amplifier have suffered various difficulties and disadvantages. Generally according to the known methods, all the tuning voltages of all the tuning circuits of the amplifier, which respectively set these circuits to the desired frequency, had to be stored in a microprocessor, or had to be determined through a complex and time consuming iterative process. The known tuning circuits for carrying out such known methods had to be able to store a large quantity of data relating to the tuning voltages, or had to carry out a lengthy iterative process, whereby the desired value could only be slowly approximated in an iterative stepwise manner.

Published European Patent Application 0,044,237 (Shepherd et al.) discloses a method of tuning an electronic circuit, and particularly a television receiver, using a plurality of variable elements and carrying out a regulation of the oscillator frequency by means of a phase-locked loop (PLL). Particularly, this reference refers to tuning a filter or oscillator using capacitance diodes. The known calibrating apparatus for carrying out the known method comprises a programmable read-only memory (PROM) that is already permanently programmed at the time of manufacturing the circuit, to store the characteristic curve function by means of which the respective desired values can be calculated. During operation of the circuit, the stored data are used to generate control signals for carrying out the electronic tuning of the circuit.

However, in this known arrangement, it is disadvantageous that the characteristic curve function is already stored in the memory at the time of manufacturing the circuit, because any possible changes or differences that might arise over time cannot be taken into account. In other words, any purposeful change in the circuitry, or in the desired tuning characteristics, or any other variation or deviation over time, requires a reprogramming of the memory, or a newly programmed memory. Any device specific deviations cannot be taken into account with this method or apparatus. Moreover, it is important in this known method to store as many points of the characteristic curve as possible in the memory, because the accuracy of the method is dependent on the number of the stored characteristic curved points. As a further disadvantage, it must be considered that this known method necessarily involves a highly active data transfer traffic when changing frequencies. Namely, each change in frequency requires new data values to be written or transferred from the memory into the phase-locked loop.

In known electronically tunable selective amplifiers, and particularly tuners, voltage controlled reactance elements such as capacitance diodes are used for tuning the pre-circuit or input circuit, intermediate circuit, and oscillator circuit. In these respective circuits, separate and independently variable tuning voltages are provided to the respective capacitance diodes that are used for the tuning. Depending on the selection of a new channel or frequency, the tuner is automatically calibrated or aligned to this new frequency by means of a microprocessor in connection with the independently adjustable tuning voltages. In order to achieve this, the microprocessor first disconnects the antenna from the input of the input circuit, and instead couples thereto a phase-locked loop controlled oscillator that is oscillating at the respective present frequency of the respective selected channel. The calibration or aligning of the individual circuits is carried out successively for each circuit by varying the respective tuning voltage that is allocated to the respective circuit. A detector connected to the output of the last circuit serves to signal when the maximum of the bandpass curve has been achieved, whereupon the calibration of the individual circuits is ended. After the end of the overall calibrating process, the antenna is once again connected to the input circuit instead of the oscillator. The tuning voltages that have been determined in this manner are then digitally stored until a new channel or frequency is selected, whereupon the calibrating process will begin anew.

In contrast to the above described known method, European Patent 0,147,518 (Heucke-Gareis et al.) discloses a method of carrying out the calibrating process using an external connectable, automatically or manually operating calibrating device. This calibrating device comprises an external intermediate memory, which intermediately stores the tuning steps or tuning parameters that have been determined according to an iterative tuning process, and then transmits optimized tuning values into a permanent or non-volatile internal memory allocated to an amplifier or tuner. In the later selection of a different channel or frequency, these stored values are then called-up from the memory and the individual tuning voltages are correspondingly adjusted. Because this internal memory must be capable of storing considerable quantities of data, the method also provides for calibrating only each $n^{th}$ channel and then interpolating the necessary tuning values for the channels lying therebetween.

One major disadvantage of the above described known method is the high memory space requirement, and a second major disadvantage is the data traffic that is necessary for each change of frequency or channel. The necessity of carrying out such a data transfer substantially disadvantages a rapid searching or seeking function or a frequency jump function for tuning to a new frequency. Such functions are not very important in present television tuners, but are extremely important in present day car radios. Namely, these functions make it possible to jump to a second alternative transmitting frequency of the same broadcast program in a rapid and preferably inaudible manner in the event of diminishing reception quality on the originally selected frequency, or to carry out a rapid seeking or searching of successive transmitting frequencies for briefly monitoring the programs present on these frequencies. Such a rapid frequency jumping function is also necessary when laying out a table of the programs to be received on the various frequencies.

German Patent Laying-Open Document 2,524,171 (Rinderle) discloses a tuning circuit that provides the necessary tuning voltage by means of a tuning potentiometer, and that includes further trimming potentiometers between the individual tuning circuits for achieving the desired aligned operation. The use of such tuning and trimming potentiometers is considered to be inexact and subject to operating errors or deviations, and does not achieve rapid and exact tuning to a selected frequency.

It is further known to use a phase-locked loop for regulating the oscillator frequency, instead of using a tuning potentiometer. This known arrangement has the advantage that a processor simply provides the desired oscillator frequency to the phase-locked loop, and the aligned operation is then necessarily defined by the setting of the calibrating potentiometer.

SUMMARY OF THE INVENTION

In view of the above it is an object of the invention to provide a method for calibrating or aligning a multistage selective amplifier, in such a manner that an aligned operation may be exactly, quickly and reliably adjusted without requiring large quantities of data to be stored and without requiring an active data transfer traffic for each change of the receiving frequency. The invention further aims to avoid or overcome disadvantages of the prior art, and to achieve additional advantages, as apparent from the present description.

The above objects have been achieved in a method of calibrating or aligning a multistage selective amplifier, and particularly a tuner, including an oscillator circuit and at least one tuning circuit, wherein an adjustable frequency-determining oscillator tuning voltage is provided for the oscillator and a respective adjustable frequency-determining tuning voltage is provided for each respective tuning circuit, in order to select or adjust the receiving frequency. According to the invention, the value of the respective tuning voltage necessary for setting each tuning circuit to the respective frequency required for achieving the calibrated or aligned operation is calculated from a mathematical relationship between the respective tuning voltage and the oscillator tuning voltage as a function of frequency, whereby the mathematical relationship is determined and stored either at the time of manufacturing the amplifier, or at the time of switching on the amplifier.

The above objects have further been achieved in a method of calibrating or balancing a multistage selective amplifier and particularly a tuner, more generally according to the invention, wherein the above mentioned value of the respective tuning voltage necessary for setting the respective tuning circuit to the desired receiving frequency is calculated from a mathematical relationship of the tuning voltage relative to the frequency. In this context also, the mathematical relationship is determined and stored either at the time of manufacturing or at the time of switching on the amplifier.

The invention achieves several advantages. Most importantly, according to the invention, it is not necessary that large quantities of data are first stored in a memory and then called up in order to achieve the desired aligned operation. As a result of this, the tuning speed is increased without requiring increased memory capacity and without requiring additional circuit arrangements that take up additional space. The values determined according to the inventive method are always exact and nearly independent of any device tolerances.

According to further advantageous embodiments of the invention, the respective tuning voltage for the input circuit, drain circuit, and/or intermediate circuit, is respectively individually determined from the oscillator tuning voltage by a mathematical relationship that is actualized each time the amplifier device is switched on. For carrying out the further calculations, it is only necessary to store two values, namely a multiplicative coefficient and an additive factor for each tuning circuit. Accordingly, only two values, per tuning circuit, must be read from the memory into the phase-locked loop upon switching on the device, and these values pertain for all of the possible selectable receiving frequencies without requiring further data storage or transfers when the receiving frequency is to be changed.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
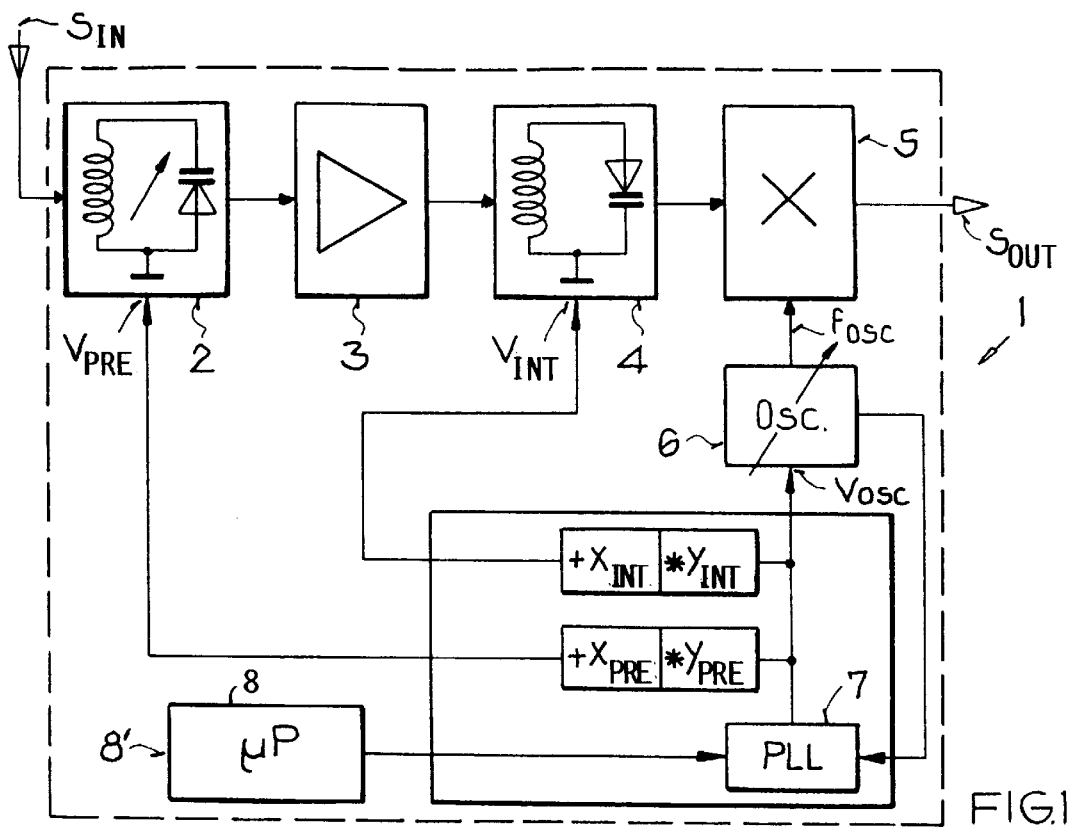
FIG. 1 is a schematic block diagram of a representative circuit for carrying out the method according to the invention.

FIG. 1 schematically shows a block circuit diagram of a tuning circuit 1 according to the invention, i.e. a tuning circuit 1 for carrying out the method according to the invention. In this example embodiment, the input signals $S_I$, such as TV or radio broadcast signals, are first filtered according to the respective selected receiving frequency in the pre-circuit or input circuit 2 and are then passed on to an amplifier 3, where the filtered signals are correspondingly amplified. Next, the filtered and amplified signals are provided to an intermediate circuit 4, which again filters the signals based on the receiving frequency or frequency range. The remaining signals at the output of the intermediate circuit 4 are provided into a mixer 5, which also receives an oscillator frequency signal $F_{OSC}$ from an oscillator circuit 6. The mixer 5 then filters out the remaining signals provided from the intermediate circuit 4 exactly to a prescribed third frequency dependent on or provided by the oscillator frequency $F_{OSC}$. Namely, the oscillator circuit 6 is set to an oscillator frequency that determines the desired receiving frequency. The final output signal $S_O$ of the mixer 5 is then conveyed further to any desired signal processing unit, for the ultimate reproduction of the program or other information being carried by the received signal.

In order to achieve an aligned operation, the frequencies or frequency ranges of the input circuit 2 and the intermediate circuit 4 must correspond to or at least include the receiving frequency, which is determined by the oscillator frequency provided in the oscillator circuit 6. The selection or adjusting of the oscillator frequency and therewith also the desired receiving frequency is carried out by means of a regulatable oscillator tuning voltage $V_{OSC}$. The oscillator circuit 6 is controlled or regulated by means of a microprocessor 8 that controls a phase-locked loop 7 which in turn determines and provides the desired receiving frequency, or more directly the oscillator frequency for the oscillator circuit 6.

The microprocessor 8 sets the corresponding oscillator tuning voltage $V_{OSC}$ for the oscillator 6 in the control loop of the oscillator phase-locked loop 7. The corresponding active elements for establishing the respective tuning voltages of the associated further tuning circuits are also connected with the phase-locked loop 7, and may further be connected to the micro-processor 8 to receive control signals therefrom. In the presently illustrated case, the input circuit 2 and the intermediate circuit 4 respectively are provided with the tuning voltages $V_{PRE}$ and $V_{INT}$, which in turn set these circuits to the receiving frequency that is defined at least indirectly by the oscillator frequency of the oscillator circuit. This voltage-dependent frequency tuning of the circuits 2 and 4 is achieved in any known manner, for example by means of voltage-controlled variable-frequency elements included in these circuits.

A basic principle underlying this aspect of the invention is an existing fixed mathematical relationship between the oscillator tuning voltage $V_{OSC}$ on the one hand, and the tuning voltage $V_{PRE}$ of the input circuit 2 or the tuning voltage $V_{INT}$ of the intermediate circuit 4, respectively, on the other hand. This mathematical relationship between the voltages is characterized by a respective multiplicative coefficient Y and a respective additive factor X. If the oscillator tuning voltage $V_{OSC}$ is known, the associated input circuit tuning voltage $V_{PRE}$ and intermediate circuit tuning voltage $V_{INT}$ are given by the following two equations:

$$V_{PRE}=V_{OSC}*Y_{PRE}+X_{PRE} \quad \text{Equation (1)}$$

$$V_{INT}=V_{OSC}*Y_{INT}+X_{INT} \quad \text{Equation (2)}$$

Thus, it is simply necessary to determine and store the coefficient Y and the factor X for each tuning circuit, in a device memory 8' associated with the microprocessor 8, for realizing the aligned operation of the amplifier device. Since the relationship between the oscillator tuning voltage $V_{OSC}$ on the one hand and the input circuit tuning voltage $V_{PRE}$ or the intermediate circuit tuning voltage $V_{INT}$ on the other hand is fixed, the additive factor X and the multiplicative coefficient Y for each circuit 2 and 4, and therewith the exact mathematical relationship, may simply be permanently determined one time when manufacturing the device, or when switching on the device for the first time, or may be repeatedly determined anew each time the device is switched on, as will be described below in connection with FIGS. 2A and 2B. In this manner, component variations or deviations, as well as time-dependent or environmentally-dependent variations and deviations of the device can be taken into account.

Figure 2A:
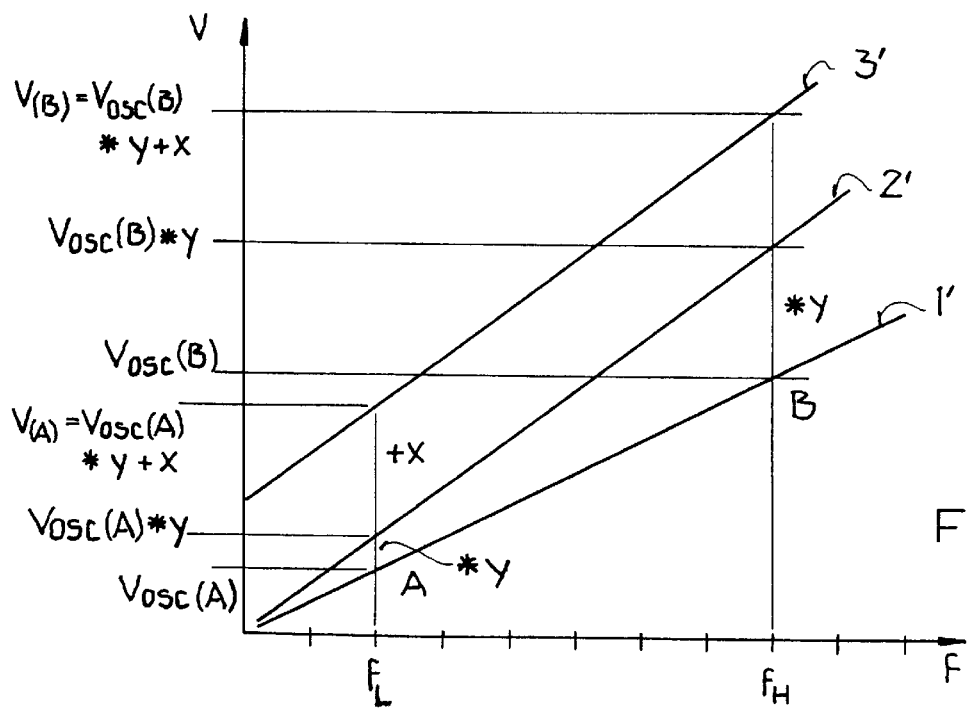
FIG. 2A is a first example graph of tuning curves for the oscillator circuit, and the input and intermediate circuits.
Figure 2B:
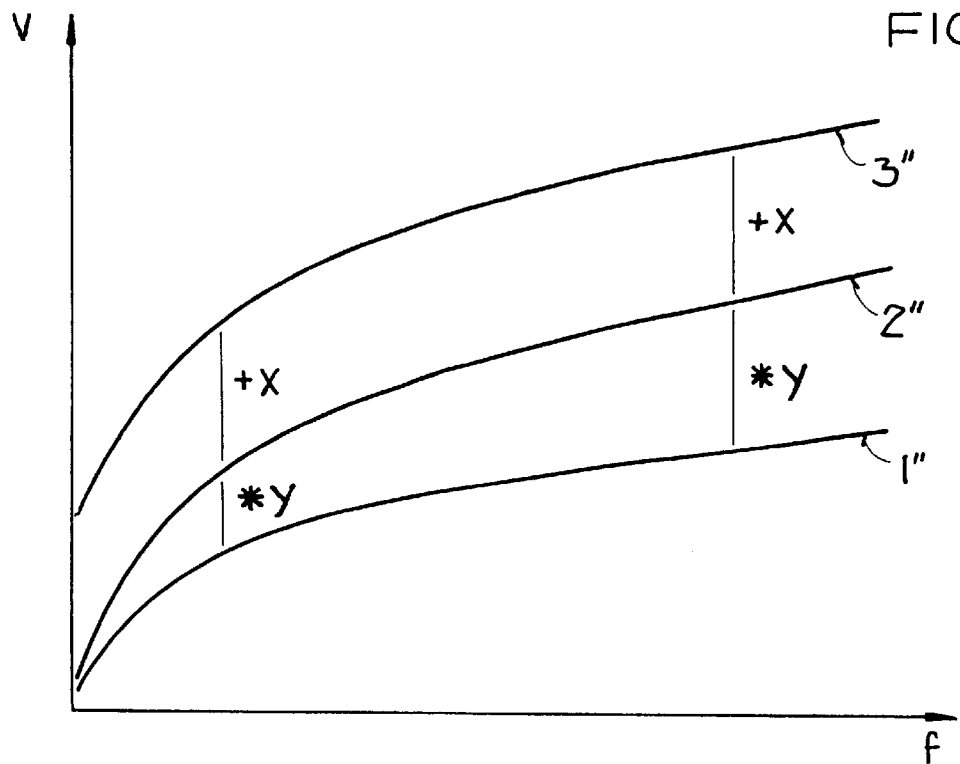
FIG. 2B is a second example graph of the tuning curves for the oscillator circuit, and the input and intermediate circuits.

FIGS. 2A and 2B respectively show two different examples for determining the tuning curves. In FIG. 2A, curve 1' shows the relationship between the oscillator tuning voltage $V_{OSC}$ and the receiving frequency f, which is a linear relationship in this example. Accordingly, the plotted curve of this relationship is a straight line and can be completely mathematically described by a linear functional equation. The curve 2' results by multiplying the curve 1' by a multiplicative coefficient Y. The curve 3', which is a respective tuning curve for the input circuit or the intermediate circuit, is determined by adding the additive factor X to the curve 2'. The respective factor X and coefficient Y relevant for each respective tuning circuit can be determined once at the time of manufacturing the device, or upon switching on the device for the first time, or each time the device is switched on, for example. These values are then written into the memory 8' of the microprocessor 8, and from there are read out and loaded into the phase-locked loop 7 for tuning the device to the selected frequency as will be described below.

Determining the respective values X and Y is achieved in an initialization process by first using the phase-locked loop 7 to set the oscillator 6 to a first aligned operation point A at a relatively low receiving frequency $f_L$. Then the corresponding receiving frequency $f_L$ is fed into the circuit as the input signal using a measuring or testing transmitter, and the field strength voltage is measured further through the receiver in a known manner. Meanwhile, the microprocessor 8, for example iteratively, varies the associated values of all of the factors X and coefficients Y in order to maximize this field strength voltage, and then the respective values of X and Y corresponding to the field strength maxima are stored. This process is repeated at a second aligned operation point B at a relatively higher receiving frequency $f_H$, and the resulting maximizing values of X and Y are stored. Once the maximizing values of X and Y are known at the two operating points A and B, then the respective voltages V(A) and V(B) can be calculated as follows by equations 3 et seq.

Alternatively during the initialization process, the processor 8 varies the tuning voltages to find the field strength maximizing condition, and then for each tuning circuit the respective tuning voltages V(A) and V(B) that resulted in the aligned operating condition, i.e. the highest output field strength voltage, at the operating points A and B are measured and retained, and from these voltages V(A) and V(B) the factors X and Y can be calculated as follows by equations 3 et seq.

Namely, the tuning voltage for the input circuit 2 for the aligned operating point A is given by:

$$V_{PRE}(A)=V_{OSC}(A)*Y_{PRE}(A)+X_{PRE}(A) \qquad \text{Equation (3)}$$

and for the aligned operating point B is given by:

$$V_{PRE}(B)=V_{OSC}(B)*Y_{PRE}(B)+X_{PRE}(B) \qquad \text{Equation (4)}$$

Furthermore, the following conditions necessarily hold true:

$$X_{PRE}(A)=X_{PRE}(A) \qquad \text{Equation (5)}$$

$$Y_{PRE}(A)=Y_{PRE}(B) \qquad \text{Equation (6)}$$

From the above equations, it is possible to calculate the multiplicative coefficient Y and the additive factor X as follows:

$$Y_{PRE} = \frac{V_{PRE}(B) - V_{PRE}(A)}{V_{OSC}(B) - V_{OSC}(A)} \qquad \text{Equation (7)}$$

$$X_{PRE} = V_{PRE}(A) - V_{OSC}(A) * Y_{PRE} \qquad \text{Equation (8)}$$

Correspondingly, the following Equations can be used to define the coefficient Y and factor X for the intermediate circuit, or in general any tuning circuit:

$$Y = \frac{V(B) - V(A)}{V_{OSC}(B) - V_{OSC}(A)} \qquad \text{Equation (9)}$$

$$X = V(A) = V_{OSC}(A) * Y \qquad \text{Equation (10)}$$

Accordingly, these values X and Y that are valid for the two calibration points A and B can be calculated for each selection or tuning circuit and stored in the memory such as memory 8'. These stored values are then respectively read into the phase-locked loop 7 according to FIG. 1 once upon switching on the device. Then, it is only necessary to additionally provide the respective oscillator frequency $f_{OSC}$ that generates the respective desired receiving frequency f, and the two point calibration is ensured.

The circuit components used for assembling the respective tuning circuit determine the shape of the respective tuning curve. In FIG. 2A, the tuning circuit is embodied in such a manner that the curve 1' is a straight line. Moreover, this means that the oscillator is so embodied as to provide a linear relationship between its controlling input voltage and frequency. By determining two points on this straight line curve 1', it is possible to directly calculate all other points along this straight line, i.e. the linear relationship is fixed by the two points. Other relationships between the voltage and the frequency are also possible, such a logarithmic, exponential, sine or cosine relationship.

For example, FIG. 2B shows an embodiment in which the tuning circuits and oscillator circuit are constructed in such a manner that the curve 1" and thus also the curves 2" and 3" respectively have a logarithmic characteristic. In this context, curve 1" in FIG. 2B shows the logarithmic relationship between the oscillator tuning voltage $V_{OSC}$ and the frequency f. Accordingly, the respective curves can each be described by a logarithmic functional equation. The curve 2" results from multiplying curve 1" by the coefficient Y, similarly as described and shown above in connection with FIG. 2A. The curve 3", which is the tuning curve for the respective input circuit or intermediate circuit, results by adding the factor X to the curve 2".

As long as the type of function, i.e. the principle progression characteristic of the functional curve, such as a linear curve or a logarithmic curve for example, is known at least over a portion of the curve, then it is sufficient to provide two known points on this functional curve in order to define or calculate all voltage values V for any given receiving frequency f, at least over this portion of the curve. Namely, once the curve characteristic is mathematically defined, and two points on the curve are fixed, then it is possible to calculate all other points along the curve for the defined portion thereof. The coefficient Y and factor X for each circuit are determined once upon manufacturing the device or upon switching on the device for the first time, or can be determined anew each time the device is switched on. During the operation of the device, these two values for each tuning circuit are stored in a non-volatile manner in a corresponding memory.

Figure 3A:
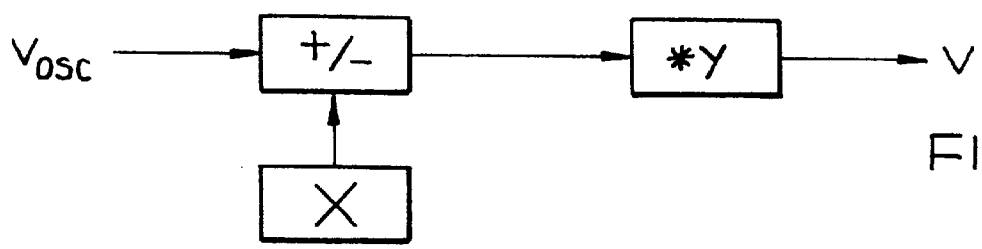
FIG. 3A is a first block flow diagram for setting or adjusting the aligned operation.
Figure 3B:
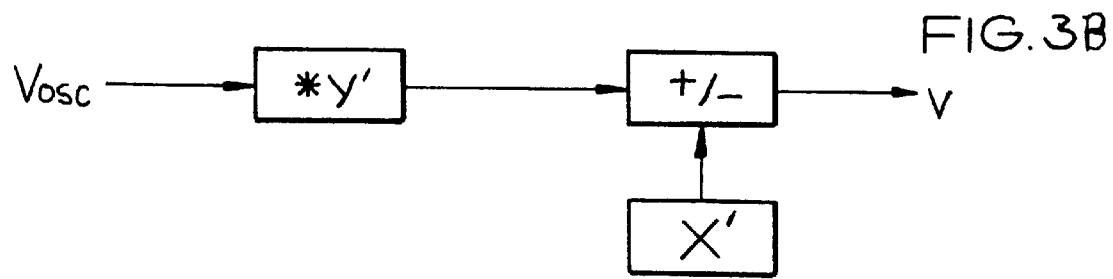
FIG. 3B is a second block flow diagram for setting or adjusting the aligned operation.
Figure 4:
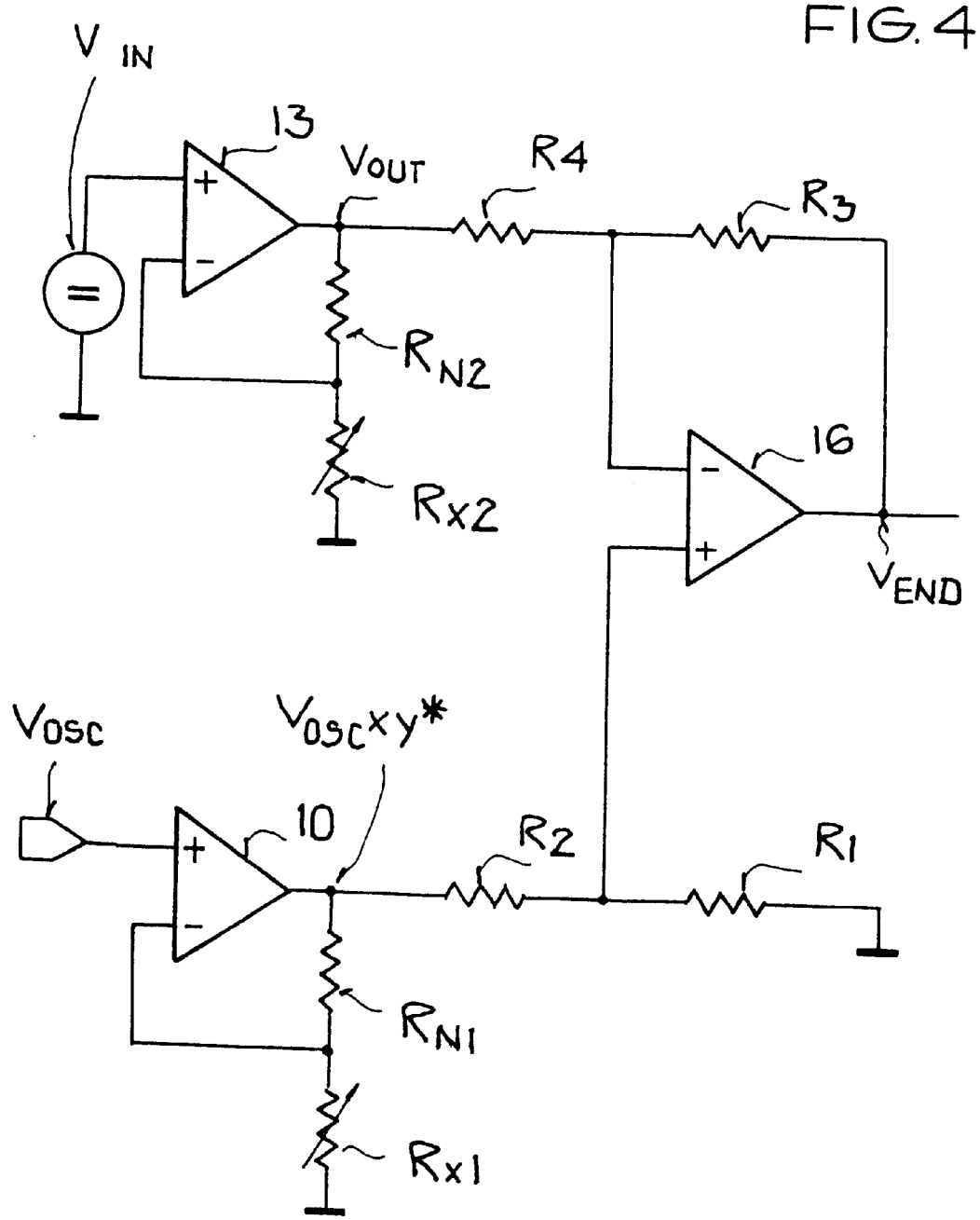
FIG. 4 is a schematic block circuit diagram of a circuit arrangement for carrying out the inventive method according to the second example flow diagram of FIG. 3B.

The calculation of the respective tuning values from the provided oscillator tuning voltage can be carried out in a manner illustrated by the schematic flow diagrams provided in FIGS. 3A and 3B. In this context, FIG. 3A shows the first possibility in which the additive factor X is first added to the initially provided oscillator tuning voltage $V_{OSC}$, and then the resulting value is multiplicatively amplified by the coefficient Y. FIG. 3B shows the second possibility in which the oscillator tuning voltage $V_{OSC}$ is first multiplicatively amplified by a different coefficient Y' and then the resulting value is additively combined with the factor X'. A circuit that realizes this possibility is illustrated in FIG. 4. Both of these possible methods lead to the same result of the tuning voltage V, namely $V_{PRE}$ for the input circuit or $V_{INT}$ for the intermediate circuit. The respective coefficients Y and factors X would be different values for the different methods.

FIG. 4 schematically illustrates a tuning circuit for carrying out the method according to the invention, and particularly for generating the tuning voltages such as $V_{PRE}$ or $V_{INT}$. Basically, this circuit arrangement receives two input voltages from two voltage sources as follows.

Figure 4A:
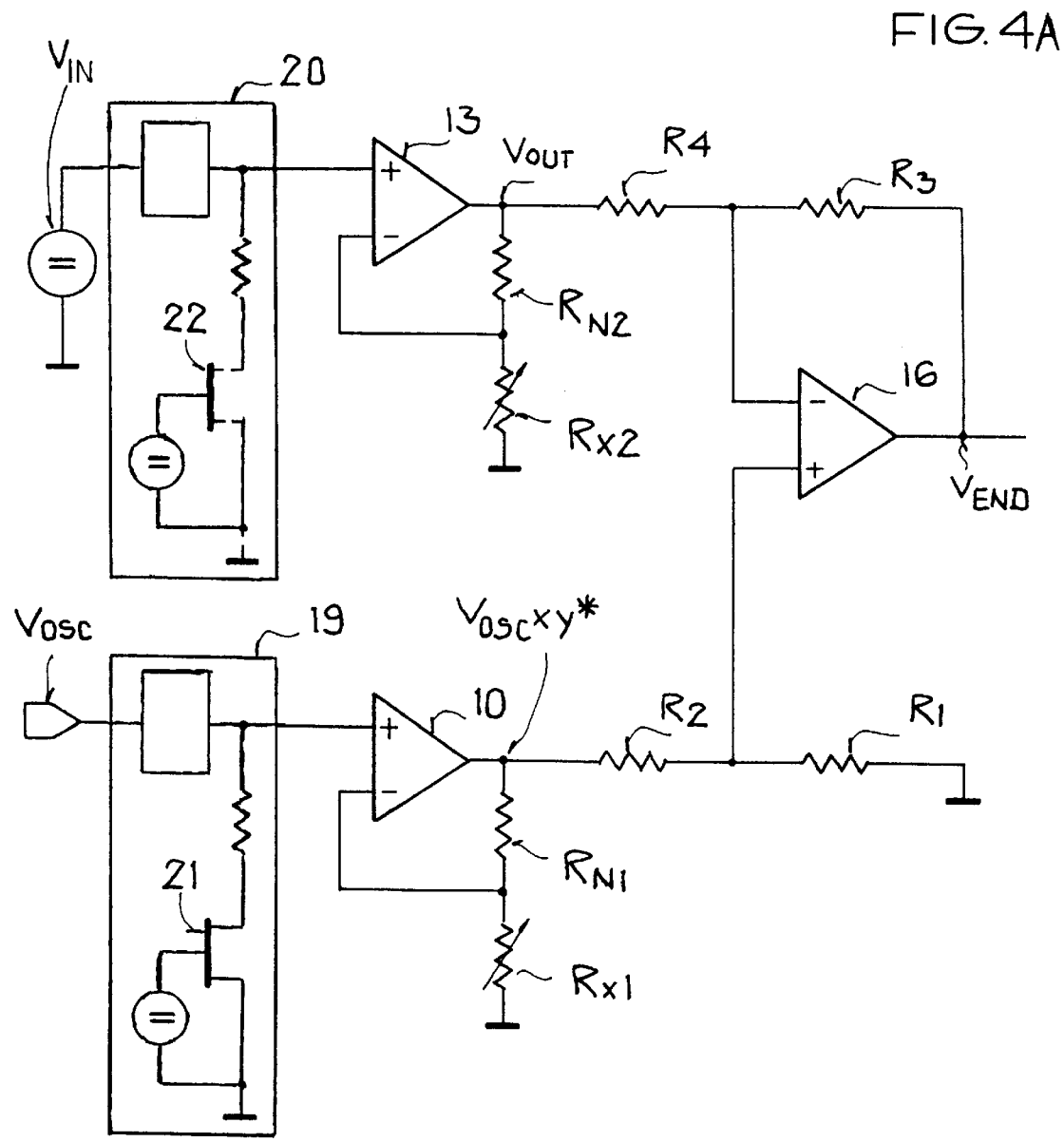
FIG. 4A is a further variant of the circuit of FIG. 4 with additional measures for compensating temperature dependence.

First, the adjustable variable oscillator tuning voltage $V_{OSC}$ is supplied to the non-inverting input of a first operational amplifier or op-amp 10. As shown in FIG. 4A and described below, a pre-divider 19 may optionally be connected between the oscillator tuning voltage $V_{OSC}$ input and the non-inverting input of the op-amp 10. As is typical in an amplifier circuit, the inverting input of the first op-amp 10 is connected to a voltage divider comprising two resistors $R_{N1}$ and $R_{X1}$. The resistor $R_{N1}$ is connected at one end to the output of the op-amp 10, and at the other end to the inverting input of the op-amp 10, and to the other variable resistor $R_{X1}$, of which one end is connected to ground and the other end is connected to the inverting input of the op-amp 10 and to the first resistor $R_{N1}$. Thereby, the voltage $V_{OSC}$ applied to the non-inverting input of the op-amp 10 is amplified by a value Y*. The resulting amplified voltage $V_{OSC} \cdot Y^*$ is connected through a resistor $R_2$ to the non-inverting input of a second op-amp 16, and through the resistor $R_2$ and a further resistor $R_1$ to ground.

Secondly, a fixed input voltage $V_{IN}$ is applied to the non-inverting input of a third op-amp 13, either directly as shown in FIG. 4, or indirectly as shown in the alternative of FIG. 4A as described below. The inverting input of the third op-amp 13 is connected to a voltage divider, in a manner as is typical for an amplifier circuit. The voltage divider comprises two resistors $R_{X2}$ and $R_{N2}$. One of the resistors $R_{N2}$ is connected at one end to the output of the op-amp 13, while the other, variable resistor $R_{X2}$ is connected at one end to ground. A common junction of the other ends of the resistors $R_{N2}$ and $R_{X2}$ is connected to the inverting input of the op-amp 13. Thereby, the voltage $V_{IN}$ applied to the non-inverting input is amplified to provide an amplified voltage $V_{OUT}$ at the output of op-amp 13, which is connected through a further resistor $R_4$ to the inverting input of the second op-amp 16, and through the resistor $R_4$ and yet another resistor $R_3$ to the output of the second op-amp 16. Finally, the second op-amp 16 provides the voltage $V_{END}$ at its output.

The purpose or function of such a circuit as shown in FIG. 4 is as follows. First, the amplifier 10 amplifies the input voltage, which is the oscillator tuning voltage $V_{OSC}$ in the present example, or which may be a corresponding voltage dependent on the oscillator tuning voltage, by the coefficient Y*. In this context, the degree of amplification is linearly adjustable with a prescribed step width and resolution. The desired linearity in this context can be achieved by respectively connecting a selected degree of binary stepped-down resistance values from the resistor $R_{X1}$ to the resistor $R_{N1}$. In this case, the variable resistor $R_{X1}$, which has been simply illustrated as a single variable resistor element, actually consists of a plurality of resistors selectively connectable in parallel by switching elements such as FET transistors which are not shown. Namely, depending on the desired resistance value of $R_{X1}$, an appropriate number of the plural resistors are connected together in parallel at any given time.

The amplification in this context is defined by:

$$Y^* = 1 + \frac{R_{N1}}{R_{X1}} \qquad \text{Equation (11)}$$

whereby the amplification factor or coefficient Y* can be set or adjusted linearly as desired by means of the adjustable resistance value, which can be achieved by control signals provided by the microprocessor 8.

The other operational amplifier 13 of the circuit of FIG. 4 provides a linearly adjustable output voltage, acting as a digital-to-analog converter. A fixed input voltage $V_{IN}$ is provided to the input of this amplifier 13, and is selectively amplified by the amplifier 13 to an extent dependent on the resistors $R_{X2}$ and $R_{N2}$ according to the same principle as described above regarding the operational amplifier 10. Thus, the output voltage $V_{OUT}$ of the op-amp 13 is defined as:

$$V_{OUT} = \left(1 + \frac{R_{N2}}{R_{X2}}\right) \times V_{IN} \qquad \text{Equation (12)}$$

In turn, the third op-amp 16 is connected to the resistors $R_3$ and $R_4$ and the resistors $R_2$ and $R_1$ in such a manner so as to act as a summing amplifier. In the case in which the value of $R_3$ is equal to the value of $R_1$, and the value of $R_4$ is equal to the value of $R_2$, then the third op-amp 16 forms an output voltage $V_{END}$ defined by:

$$V_{END} = ((V_{OSC} \times Y^*) + V_{OUT}) \times \frac{R_1}{R_2} \qquad \text{Equation (13)}$$

In this circuit, the multiplicative coefficient Y is given by:

$$Y = Y^* \times \frac{R_1}{R_2} \qquad \text{Equation (14)}$$

and the additive factor X is given by:

$$X = V_{OUT} \times \frac{R_1}{R_2} \qquad \text{Equation (15)}$$

Thus, as described above, the previously determined multiplicative coefficients Y and additive factors X can be applied as needed for generating the tuning voltages using this circuit according to FIG. 4 or 4A.

Now referring to FIG. 4A, the illustrated circuit corresponds to that of FIG. 4 except for the additional pre-dividers 19 and 20 installed at the inputs. The pre-divider 19 comprises two resistances, a field effect transistor 21 (FET) and a d.c. voltage source that is connected between the gate and the source terminals of the FET 21. One of the resistors is connected to the drain terminal of the FET 21, while the other resistor is connected to the oscillator tuning voltage $V_{OSC}$, and a common junction between the two resistors is connected to the non-inverting input of the first op-amp 10. The pre-divider 20 is similarly embodied and connected between the fixed input voltage $V_{IN}$ and the non-inverting input of the op-amp 13. The pre-divider 20 comprises two resistors, a field effect transistor (FET) 22 and a d.c. voltage source connected between the gate and source terminals of the FET 22. One of the resistors is connected to the drain terminal of the FET 22, and the other one of the resistors is connected to the fixed input voltage $V_{IN}$. A common junction between the two resistors is then connected to the non-inverting input of the third op-amp 13.

The function of the pre-dividers 19 and 20 is to compensate for a temperature dependence effect, as follows. The resistance values of $R_{X1}$ and $R_{X2}$ respectively can be provided by selectively connecting binary staged or stepped-down resistors using FET transistors as switches for connecting the appropriate arrangement of resistors. However, temperature dependent deviations can arise in the resulting resistance value, since the FET transistors used for selectively connecting the resistors have a temperature dependent operation. As a result, the overall amplification characteristic would vary with temperature. In order to compensate this effect, the pre-dividers 19 and 20 are installed in the circuit, whereby these pre-dividers 19 and 20 each respectively include a similar temperature dependent FET transistor 21 or 22 respectively. The circuit arrangement and operation of the pre-dividers 19 and 20 is such that the temperature dependence of the FET transistors 21 and 22 will compensate for or oppose the temperature dependence of the FET transistors used as switches for selectively connecting the amplification-controlling resistors.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of calibrating, to a selected receiving frequency, a multistage selective amplifier including an oscillator circuit that outputs a selectively variable oscillator output frequency dependent on and responsive to a variable oscillator input voltage, at least one tuning circuit that is tunable to a selectively variable tuning circuit frequency dependent on and responsive to a variable tuning voltage, and a memory, wherein said method comprises:

a) for each one of said at least one tuning circuit, determining a respective mathematical equation defining a relationship between said oscillator input voltage and said tuning voltage as a function of frequency, and storing equation data characterizing said respective mathematical equation in said memory;

b) generating said oscillator input voltage with a proper oscillator voltage value dependent on said selected receiving frequency, and applying said oscillator input voltage to said oscillator circuit, such that said oscillator output frequency corresponds to or is frequency shifted from said selected receiving frequency;

c) for each one of said at least one tuning circuit, calling up said equation data from said memory, and generating said tuning voltage with a proper tuning voltage value by modifying said oscillator input voltage in accordance with said equation data characterizing said mathematical equation, and applying said tuning voltage with said proper tuning voltage value respectively to said at least one tuning circuit, such that said tuning circuit frequency at least includes said selected receiving frequency.

2. The method according to claim 1, wherein said determining of said respective mathematical equation and said storing of said equation data are carried out once at a time of manufacturing said amplifier, and wherein said equation data remain permanently stored in said memory.

3. The method according to claim 1, wherein said determining of said respective mathematical equation and said storing of said equation data are carried out once at the first time said amplifier is switched on, and wherein said equation data remain permanently stored in said memory.

4. The method according to claim 1, wherein said determining of said respective mathematical equation and said storing of said equation data are carried out respectively anew each time said amplifier is switched on, and wherein said equation data remain stored in said memory only until said amplifier is switched off.

5. The method according to claim 1, wherein said amplifier includes a plurality of said tuning circuit.

6. The method according to claim 1, wherein said respective mathematical equation is expressed by a voltage function selected from $h_i(z)=(Y_i \cdot g(z))+X_i$ and $h_i(z)=Y_i \cdot (g(z)+X_i)$, wherein z is frequency, i identifies said respective tuning circuit, h is said tuning voltage, g is an elementary function characterizing said oscillator input voltage as a function of frequency, Y is a multiplicative coefficient, and X is an additive factor, and wherein said equation data includes at least respective values of said $Y_i$ and said $X_i$.

7. The method according to claim 6, wherein said voltage function is $h_i(z)=(Y_i \cdot g(z))+X_i$.

8. The method according to claim 6, wherein said voltage function is $h_i(z)=Y_i \cdot (g(z)+X_i)$.

9. The method according to claim 6, wherein said elementary function g(z) is selected from the group consisting of $g(z)=z$, $g(z)=e^z$, $g(z)=\log z$, $g(z)=\cos z$, and $g(z)=\sin z$.

10. The method according to claim 6,
wherein said elementary function g(z) is a known function for said oscillator circuit,
and wherein said determining of said respective mathematical equation comprises determining said multiplicative coefficient Y and said additive factor X, for each said tuning circuit, by carrying out a respective test calibration at respective first and second different test frequencies ($f_L$ and $f_H$), measuring respective first and second optimal tuning voltages ($h(f_L)$ and $h(f_H)$) at said first and second test frequencies, and calculating said multiplicative coefficient Y and said additive factor X by solving said mathematical equation for said first and second optimal tuning voltages at said first and second different test frequencies.

11. The method according to claim 10, wherein said respective test calibration comprises an iterative calibration process comprising feeding an input signal having said selected receiving frequency into said amplifier and measuring an output field strength voltage, while varying said tuning voltage applied to said respective tuning circuit, wherein said optimal tuning voltage is respectively said tuning voltage being applied to said respective tuning circuit when said output field strength is maximized.

12. The method according to claim 10, wherein $$Yi = \frac{h_i(f_H) - h_i(f_L)}{g(f_H) - g(f_L)}$$

and $X_i = h_i(f_L) - (g(f_L) \cdot Y_i)$.

13. The method according to claim 6, wherein said equation data stored in said memory consists of and is limited to said respective values of said $Y_i$ and said $X_i$ for each said tuning circuit.

14. The method according to claim 6, wherein said generating of said tuning voltage with said proper tuning voltage value comprises amplifying said oscillator input voltage multiplicatively by said multiplicative coefficient Y, and additively increasing said oscillator input voltage by said additive factor X either before or after said amplifying, in accordance with said voltage function, to provide said tuning voltage h.

15. The method according to claim 1, wherein said tuning circuit frequency corresponds to said selected receiving frequency.

16. A method of calibrating, to a selected receiving frequency, a multistage selective amplifier including an oscillator circuit that outputs a selectively variable oscillator output frequency dependent on and responsive to a variable oscillator input voltage, at least one tuning circuit that is tunable to a selectively variable tuning circuit frequency dependent on and responsive to a variable tuning voltage, and a memory, wherein said method comprises:

a) for each one of said at least one tuning circuit, determining a respective mathematical equation defining said tuning voltage as a function of frequency, and storing equation data characterizing said respective mathematical equation in said memory;

b) generating said oscillator input voltage with a proper oscillator voltage value dependent on said selected receiving frequency, and applying said oscillator input voltage to said oscillator circuit, such that said oscillator output frequency corresponds to or is frequency shifted from said selected receiving frequency;

c) for each one of said at least one tuning circuit, calling up said equation data from said memory, and generating said tuning voltage with a proper tuning voltage value in accordance with said equation data characterizing said mathematical equation at said selected receiving frequency, and applying said tuning voltage with said proper tuning voltage value respectively to said at least one tuning circuit, such that said tuning circuit frequency corresponds to said selected receiving frequency.

17. The method according to claim 16, wherein said determining of said respective mathematical equation and said storing of said equation data are carried out once at a time of manufacturing said amplifier, and wherein said equation data remain permanently stored in said memory.

18. The method according to claim 16, wherein said determining of said respective mathematical equation and said storing of said equation data are carried out once at the first time said amplifier is switched on, and wherein said equation data remain permanently stored in said memory.

19. The method according to claim 16, wherein said determining of said respective mathematical equation and said storing of said equation data are carried out respectively anew each time said amplifier is switched on, and wherein said equation data remain stored in said memory only until said amplifier is switched off.

20. A tunable multistage selective amplifier comprising:

an oscillator circuit having an input adapted to receive a variable oscillator voltage and an output adapted to provide a variable oscillator frequency that is responsive to and dependent on said oscillator voltage, at least one tuning circuit having a signal input adapted to receive an input signal, a tuning input adapted to receive a variable tuning voltage, and an output adapted to provide an output signal derived from said input signal filtered by a variable receiving frequency that is responsive to and dependent on said tuning voltage, a phase-locked loop circuit having a control input adapted to receive a control signal, and an output adapted to provide said oscillator voltage responsive to and dependent on said control signal, a microprocessor connected to said control input of said phase-locked loop circuit and adapted to provide said control signal, a memory connected to said microprocessor and adapted to store therein and provide to said microprocessor a respective multiplicative coefficient and a respective additive factor for each said tuning circuit, and a respective multiplicative and additive amplifier circuit connected between said output of said phase-locked loop circuit and said tuning input of said tuning circuit, and connected at least indirectly to said memory to receive data characterizing said multiplicative coefficient and said additive factor, so as to receive said oscillator voltage and multiplicatively amplify said oscillator voltage by said multiplicative coefficient and additively increase said oscillator voltage by said additive factor and thereby to generate said tuning voltage.

* * * * *